(12) United States Patent
Lee et al.

(10) Patent No.: US 8,937,291 B2
(45) Date of Patent: Jan. 20, 2015

(54) THREE-DIMENSIONAL ARRAY STRUCTURE FOR MEMORY DEVICES

(75) Inventors: Ming-Hsiu Lee, Hsinchu (TW); Wei-Chih Chien, Sijhih (TW)

(73) Assignee: Macronix International Co., Ltd. (TW)

( * ) Notice: Subject to any disclaimer, the term of this patent is extended or adjusted under 35 U.S.C. 154(b) by 412 days.

(21) Appl. No.: 13/528,754

(22) Filed: Jun. 20, 2012

(65) Prior Publication Data

US 2013/0341753 A1 Dec. 26, 2013

(51) Int. Cl.
*H01L 47/00* (2006.01)
*H01L 29/06* (2006.01)

(52) U.S. Cl.
USPC ............. 257/4; 257/2; 257/E27.072; 365/148

(58) Field of Classification Search
CPC .............. H01L 27/0688; H01L 27/101; H01L 27/1022
USPC .............. 257/2, 4, 5, E27.072; 365/148, 164, 365/174, 175
See application file for complete search history.

(56) References Cited

U.S. PATENT DOCUMENTS

2007/0132049 A1* 6/2007 Stipe ............................. 257/421
2011/0170331 A1* 7/2011 Oh et al. ........................ 365/148
2012/0280201 A1* 11/2012 Sekar et al. ....................... 257/4

* cited by examiner

*Primary Examiner* — Jose R Diaz
(74) *Attorney, Agent, or Firm* — Baker & McKenzie LLP

(57) ABSTRACT

A disclosed memory device includes a three-dimension array structure that includes memory layers and transistor structures disposed between the memory layers. Each memory layer is connected to a common electrode, and each transistor structure includes transistors that share common column structures and common base structures. The transistors also each include a connector structure that is spaced apart from a common column structure by a common base structure.

19 Claims, 17 Drawing Sheets

THREE-DIMENSIONAL ARRAY STRUCTURE FOR MEMORY DEVICES

BACKGROUND

1. Technical Field

The present application relates to memory devices, and more particularly to memory devices having a three-dimensional array structure and methods of making such devices.

2. Related Art

Memory devices may include memory elements that have two terminals, such as resistive random-access memory (ReRAM). Data may be written in a ReRAM by varying the resistivity levels of the memory elements in the ReRAM. The memory elements may be connected to transistors, such as a bipolar junction transistor (BJT), to allow for changes in the resistivity level of the memory elements.

To provide a ReRAM with high memory density, the memory elements and the transistors may be arranged in stacking array structures. Conventional three-dimensional (3D) array structures may provide a dense 3D array of memory elements and transistors on a limited silicon substrate area. Such conventional 3D array structures are manufactured in a layer-by-layer process, which is also known as a stacking process. The stacking process is expensive and time-consuming, especially with the advanced lithography process involved becoming more costly as manufacturing scales down. As such, a novel 3D array structure that allows for a more cost-effective process for manufacturing high-density memory devices.

SUMMARY

An embodiment disclosed herein is directed to a memory device comprising a memory layer having first and second surface portions and being connected a common electrode; and first and second transistor arrays. The first and second transistor arrays may comprise transistors connected to the first and second surface portions of the memory layer, respectively, wherein each transistor in the first transistor array is operable to address a respective memory storage region in the first surface portion of the memory layer, and each transistor in the second transistor array is operable to address a respective memory storage region in the second surface portion of the memory layer. The first transistor array may comprise common column structures disposed transversely through a plurality of common base structure such that transistors arranged in each column of the first transistor array share a common column structure, and transistors arranged in each row of the first transistor array share a common base structure. Further, the transistors of the first transistor array may each comprise a connector structure that is spaced apart from a respective common column structure by a respective common base structure and that is connected to the first surface portion of the memory layer. The second transistor array may comprise common column structures disposed transversely through a plurality of common base structure such that transistors arranged in each column of the second transistor array share a common column structure, and transistors arranged in each row of the second transistor array share a common base structure. Further the transistors of the second transistor array may each comprise a connector structure that is spaced apart from a respective common column structure by a respective common base structure and that is connected to the second surface portion of the memory layer.

Another embodiment disclosed herein is directed to a memory device having a three-dimensional array structure. The disclosed the memory device comprises a plurality of electrodes, memory layers each having opposing first and second surface portion and being connect to one of the plurality of electrodes, wherein the memory layers are spaced apart by along a first longitudinal direction, transistor array structures between the memory layers. Each transistor array structure may comprise a plurality of common column structures each extending along a second longitudinal direction, a plurality of common base structures each extending along a third longitudinal direction, wherein the plurality of common column structures are disposed transversely through the plurality of common base structures. Each transistor array structure may further comprise a first plurality of connector structures each extending along the first longitudinal direction and being spaced apart from the plurality of common column structures by one of the plurality of common base structures, the first plurality of connector structures each are connected the first surface portion of a first memory layer, and a second plurality of connector structures each extending along the first longitudinal direction and being spaced apart from the plurality of common column structures by one of the plurality of common base structures, the second plurality of connector structures each are connected the second surface portion of a second memory layer. The first surface portion of the first memory layer faces the second surface portion of the second memory layer.

An exemplary embodiment disclosed herein is directed to a method of forming a three-dimensional array structure. The disclosed method comprises forming a first intermediate structure comprising semiconductive layers interlaced with dielectric layers, adding impurities of a first type in a first plurality of regions in each semiconductive layer, adding impurities of a second type in a second plurality of regions in each semiconductive layer. The disclosed method further includes removing portions of the first intermediate structure to form an intermediate array structure comprising a plurality of connector structures spaced apart along a first longitudinal direction by a plurality of common base structures extending along a second longitudinal direction, wherein the plurality of connector structures have impurities of the first type and the plurality of common base have impurities of the second type. The disclosed method also includes etching through the plurality of common base structures and the interlacing dielectric layers such that a first plurality of voids are defined in the plurality of common base structures, the plurality of voids being proximate to the plurality of connector structures and extending along a third longitudinal direction. Additionally, the disclosed method includes filling the first plurality of voids with a semiconductive material to form a plurality of common column structures that have impurities of the first type, etching through each of the plurality of connector structures in the intermediate array structures and the interlacing dielectric layers therebetween to form a plurality of transistor structures spaced apart from each other, and depositing memory layers and conduction layers connected to the memory layers, wherein the memory layers are deposited between the transistor structures and connected to the connector structures of adjacent transistor structures.

Another exemplary embodiment is directed to a memory device comprising first and second electrodes and first and second memory structures connected to the first and second electrodes, respectively. The first and second memory structures may be spaced apart. The disclosed memory device may further comprise common base structures between the first and second memory structures, the common base structures extending parallel to each other, common column structures disposed transversely through the common base structures, and common connector structures, each connecting one of the common base structures to the one of the first and second memory layers. In an embodiment, the common base structures, common column structures, and the common connector structure may define a plurality of bipolar junction transistors.

BRIEF DESCRIPTION OF THE DRAWINGS

Features, aspects, and embodiments of the inventions are described in conjunction with the attached drawings, in which.

DETAILED DESCRIPTION

Figure 1:
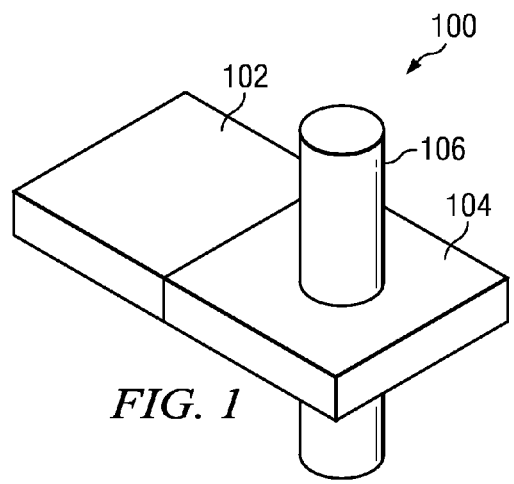
FIG. 1 shows an elevational view of the 3D structure of a BJT device according to the present disclosure.

FIG. 1 is a schematic diagram showing the 3D structure of a BJT device 100. The BJT device 100 comprises a first, second, and third portions 102, 104, and 106. The first portion 102 may be connected to the second portion 104 and spaced apart from the portion 106, which is disposed through the portion 104. It is to be appreciated that the first, second, and third portions 102, 104, and 106 of the BJT device 100 may comprise a semiconductive material and may be configured to include impurities that allow for various combinations of conductivities. In an exemplary embodiment, the first and third portions 102, 106 both have a first type of conductivity, such as N-type or P-type, while the second portion 104 has a second type of conductivity that is different from the conductivity of the first and third portions 102, 106. Sharing the same type conductivity, the portions 102, 106 may each define the emitter or the collector of the BJT device 100. More specifically, one of the portions 102, 106 may include a higher concentration of impurities so as to define the emitter of the BJT device 100, and the other one of the portions 102, 106 may have a lower concentration of impurities so as to define the collector of the BJT device 100. Referring to the alternatives between defining the emitter or the collector, the portion 102 may be referred to as the connector structure 102. Referring to the alternatives between defining the collector or the emitter depending on its concentration of impurities relative to that of the portion 102, the portion 106 may be referred to as the column structure 106. Referring to the second type of conductivity, the second portion 104 may be referred to as the base 104.

Figure 2A:
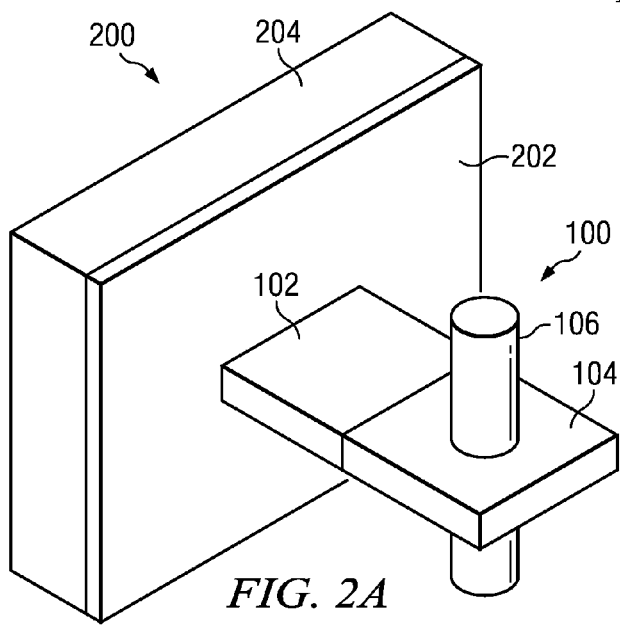
FIGS. 2A and 2B illustrate an embodiment of a single memory cell comprising the BJT device shown in FIG. 1 according to the present disclosure.
Figure 2B:
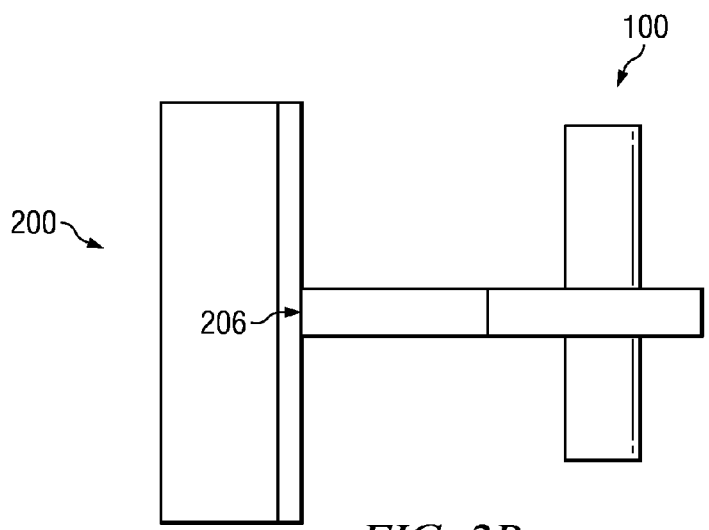

FIG. 2A illustrate an elevational view of a single memory cell 200 comprising the BJT device 100 shown in FIG. 1. FIG. 2B is a side view of the single memory cell 200. The memory cell 200 further includes a memory layer 202 connected to the BJT device 100 and an electrode 204 connected to the memory layer 202. The memory layer 202 interconnects the BJT device 100 and the electrode layer 204 and may be a resistance change layer comprising hafnium oxide, or tungsten oxide, or $Ge_xSb_yTe_z$ alloy. The connector structure 102 is connected to memory layer 202 such that the resistance at a memory storage region 206 proximate to the interface between the connector structure 102 and the memory layer 202 may be varied by varying the voltage at the electrode layer 204, the column structure 106, and the base 104. It is to be appreciated that when incorporated in a memory device (not shown) of the present disclosure, each memory storage region 206 may be considered as a memory element 206 of the memory device.

Figure 3A:
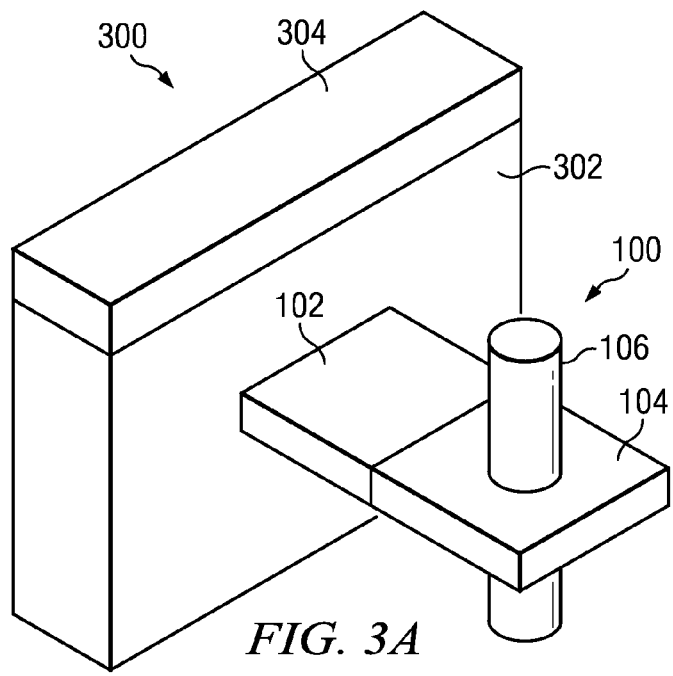
FIGS. 3A and 3B illustrate another embodiment of a single memory cell comprising the BJT device shown in FIG. 1 according to the present disclosure.
Figure 3B:
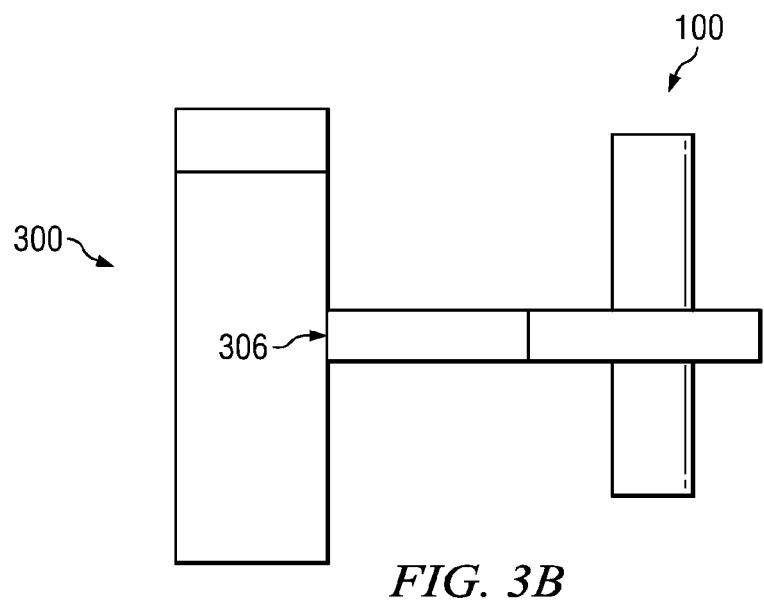

FIG. 3A illustrate an elevational view of a single memory cell 300 comprising the BJT device 100 shown in FIG. 1. FIG. 3B is a side view of the single memory cell 300. Similar to the memory cell 200, the memory cell 300 further includes a memory layer 302 connected to the BJT device 100 and an electrode 304 connected to the memory layer 304. The memory layer 302 interconnects the BJT device 100 and the electrode 304 and may be a resistance change layer comprising hafnium oxide, tungsten oxide, or $Ge_xSb_yTe_z$ alloy. The connector structure 102 is connected to memory layer 302 such that the resistance at a memory storage region 306 proximate to the interface between the connector structure 102 and the memory layer 302 may be varied by varying the voltage at the electrode 304, the column structure 106, and the base 104. It is to be appreciated that when incorporated in a memory device (not shown) of the present disclosure, each memory storage region 306 may be considered as a memory element 306 of the memory device.

Referring to FIGS. 2A-B and 3A-B, the memory cells 200 and 300 may have similar electrical connections as discussed above, but may have different physical configurations. As shown in FIG. 2A-B, the electrode layer 204 may be position adjacent to a side surface of the memory layer 202 such that the interface region 206 of the memory cell 200 is sandwiched between the electrode layer 204 and the connector structure 102. As shown in FIG. 3A-B, the electrode layer 304 may be positioned on a top surface of the memory layer 302 such that the interface region 306 of the memory cell 300 is not sandwiched between the electrode layer 304 and the connector structure 102. It is to be appreciated that the memory cells of the present disclosure may be configured according to either configuration shown in FIGS. 2A-B or 3A-B.

Figure 4A:
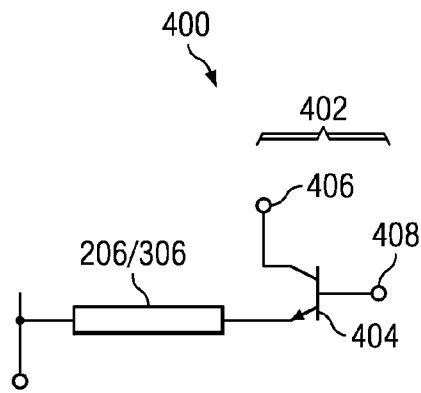
FIG. 4A illustrates an exemplary memories cell having a first configuration of the BJT device shown in FIG. 1 according to the present disclosure.

FIGS. 4A-D are schematic diagrams showing various exemplary memories cells that may be obtained by configuring BJT device 100 differently. Shown in FIG. 4A is a memory cell 400 that may have a physical structure similar to the memory cell 200 or 300, in which the connector structure 102 is connected to the memory element 206 or 306. The memory cell 400 includes an npn BJT 402, in which the emitter 404 and collector 406 have N-type conductivity while the base 408 has P-type conductivity. The connector structure 102 shown in FIGS. 1-3 defines the emitter 404 of the BJT 402 while the column structure 106 shown in FIG. 1-3 defines the collector 406 of the BJT 402. The memory element 206 or 306 is connected to the emitter 404.

Figure 4B:
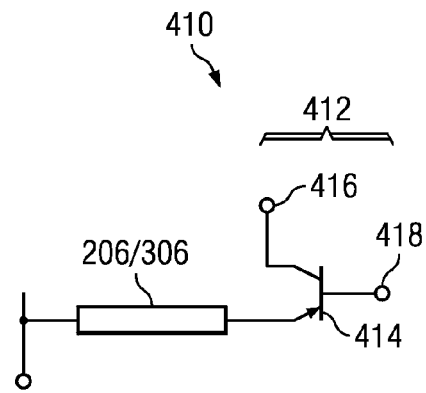
FIG. 4B illustrates an exemplary memories cell having a second configuration of the BJT device shown in FIG. 1 according to the present disclosure.

Shown in FIG. 4B is a memory cell 410 that may have a physical structure similar to the memory cell 200 or 300, in which the connector structure 102 is connected to the memory element 206 or 306. The memory cell 420 includes a pnp BJT 412, in which the emitter 414 and collector 416 have P-type conductivity while the base 488 has N-type conductivity. The connector structure 102 shown in FIGS. 1-3 defines the emitter 414 of the BJT 412 while the column structure 106 shown in FIG. 1-3 defines the collector 416 of the BJT 412. The memory element 206 or 306 is connected to the emitter 414.

Figure 4C:
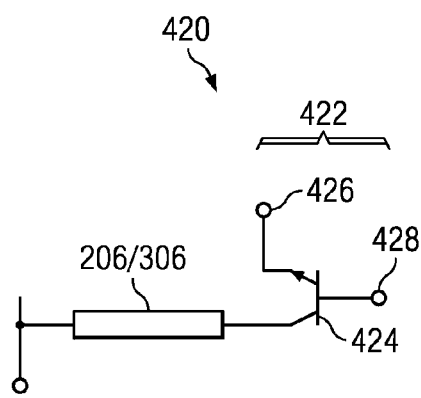
FIG. 4C illustrates an exemplary memories cell having a third configuration of the BJT device shown in FIG. 1 according to the present disclosure.

Shown in FIG. 4C is a memory cell 420 that may have a physical structure similar to the memory cell 200 or 300, in which the connector structure 102 is connected to the memory element 206 or 306. The memory cell 420 includes an npn BJT 422, in which the emitter 424 and collector 426 have N-type conductivity while the base 428 has P-type conductivity. The connector structure 102 shown in FIGS. 1-3 defines the collector 424 of the BJT 422 while the column structure 106 shown in FIG. 1-3 defines the emitter 426 of the BJT 422. The memory element 206 or 306 is connected to the collector 424.

Figure 4D:
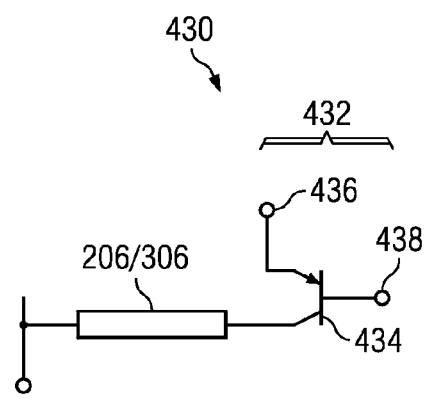
FIG. 4D illustrates an exemplary memories cell having a fourth configuration of the BJT device shown in FIG. 1 according to the present disclosure.

Shown in FIG. 4D is a memory cell 440 that may have a physical structure similar to the memory cell 200 or 300, in which the connector structure 102 is connected to the memory element 206 or 306. The memory cell 430 includes a pnp BJT 432, in which the emitter 434 and collector 436 have P-type conductivity while the base 438 has N-type conductivity. The connector structure 102 shown in FIGS. 1-3 defines the collector 434 of the BJT 432 while the column structure 106 shown in FIG. 1-3 defines the emitter 436 of the BJT 432. The memory element 206 or 306 is connected to the collector 434.

Referring back to the embodiment shown in FIGS. 2A-B and 3A-B, a plurality of BJT devices 100 may be connected to the memory layer 204 to form an array of memory cells 200 or 300. As shown in FIGS. 2A-B and 3A-B, the memory layer 204 extends in a first plane while the connector structure 102 and base 104 extend in a second plane perpendicular to the first plane. The collector structure 106 extends parallel to the first plane. Such a configuration of the BJT device 100 allows a 3D array structure to be formed cost effectively using a method of the present disclosure that includes forming an array of BJT device 100 and connecting the array of BJT device 100 to memory layers 204. Exemplary embodiments of such a method will be described in another section of the present disclosure.

Figure 5A:
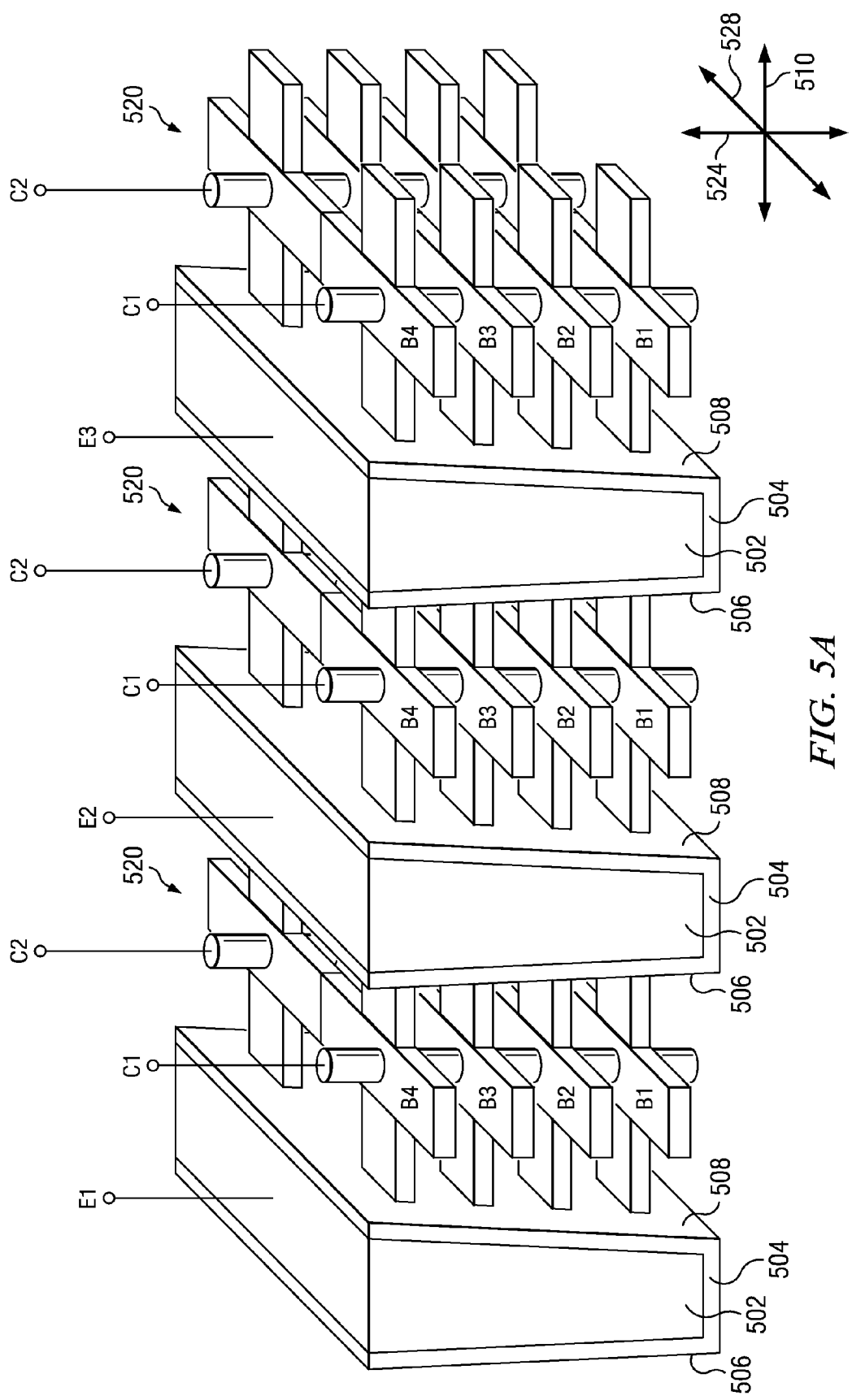
FIG. 5A shows an elevational view of an exemplary 3D array structure according to the present disclosure.
Figure 5B:
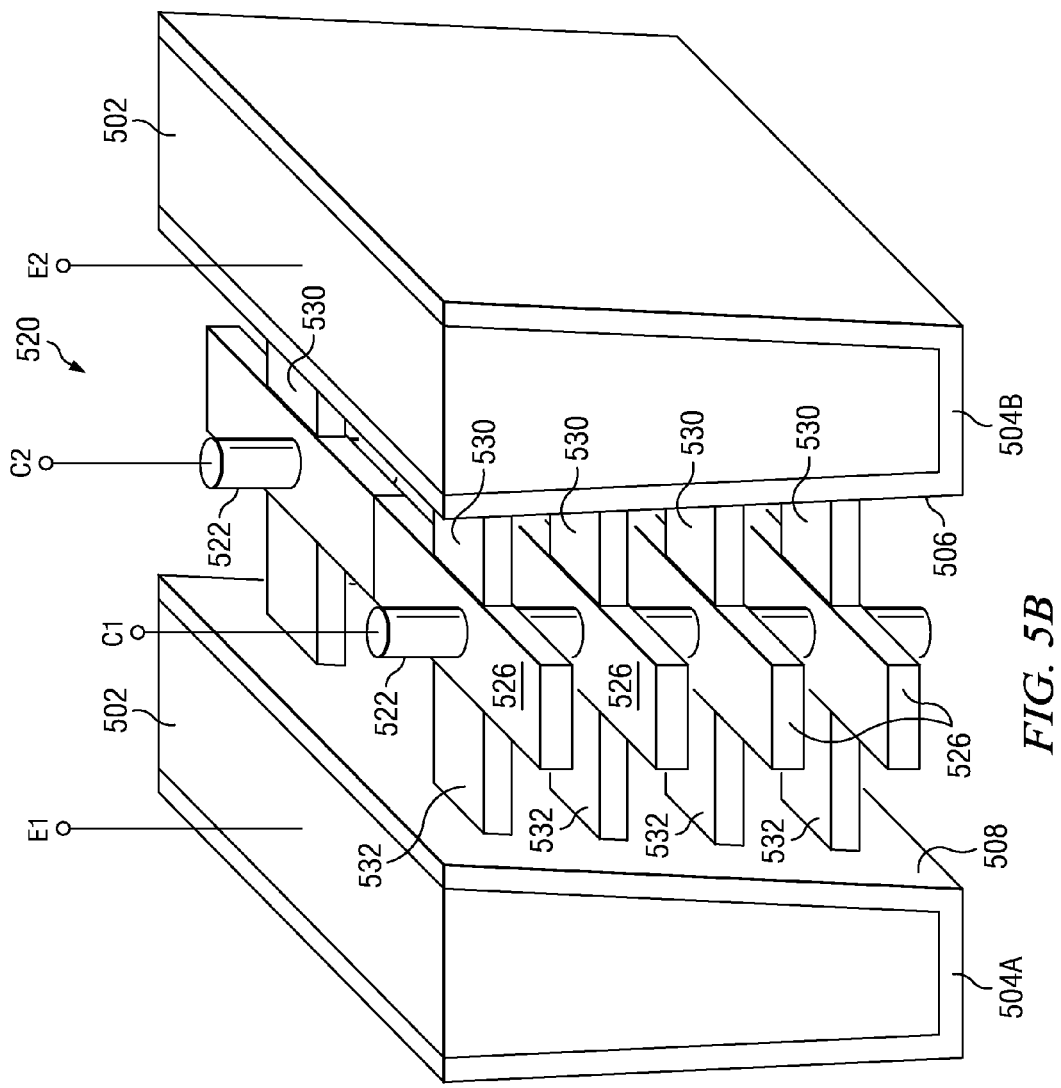
FIG. 5B shows a focused view of a portion of the exemplary 3D array structure shown in FIG. 5A according to the present disclosure.

Turning now to FIG. 5A, illustrated is an elevational view of an exemplary 3D array structure 500. The array structure 500 includes a plurality of electrodes 502, and memory structures 504 each having opposing first and second surface portion 506, 508 and being connect to one of the plurality of electrodes 502. The memory structure 504 may include memory layers 504 that are spaced apart by along a first longitudinal direction indicated by the direction arrow 510. The 3D array structure 500 further includes transistor array structures 520 between the memory layers 504. FIG. 5B shows a focused view of a representative transistor array structure 520 between first and second representative memory layers 504A, 504B.

Referring to FIGS. 5A and 5B, in an embodiment, each transistor array structure 520 may comprise a plurality of common column structures 522 each extending along a second longitudinal direction indicated by the direction arrow 524. Each transistor array structure 520 may further comprise a plurality of common base structures 526 each extending along a third longitudinal direction indicated by the direction arrow 528. It is to be appreciated that the first, second, and third longitudinal directions may have a variety of orientations relative to each other, thereby resulting in arrays of various configurations. In an exemplary embodiment, the second and third longitudinal directions 524, 528 may be orthogonal to each other. In addition, the first longitudinal direction 510 may be orthogonal to both the second and third longitudinal directions 524, 528 to allow for efficient use of space.

In an embodiment, the plurality of common column structures 522 are disposed transversely through the plurality of common base structures 526. Additionally, each transistor array structure 520 may include first and second plurality of connector structures 530, 532. The first plurality of connector structures 530 each are connected the first surface portion 506 of one of the memory layers 504, and the second plurality of connector structures 532 each are connected the second surface portion 508 of the next one of the memory layers 504. The first plurality of connector structures 530 each extend along the first longitudinal direction and are spaced apart from the plurality of common column structures 522 by one of the plurality of common base structures 526. The second plurality of connector structures 532 each extend along the first longitudinal direction and are spaced apart from the plurality of common column structures 522 by one of the plurality of common base structures 526. It is to be appreciated that as shown in FIGS. 5A and 5B, the first surface portion 506 of one of the memory layers 504 faces the second surface portion 508 of the next one of the memory layers 504.

Figure 5C:
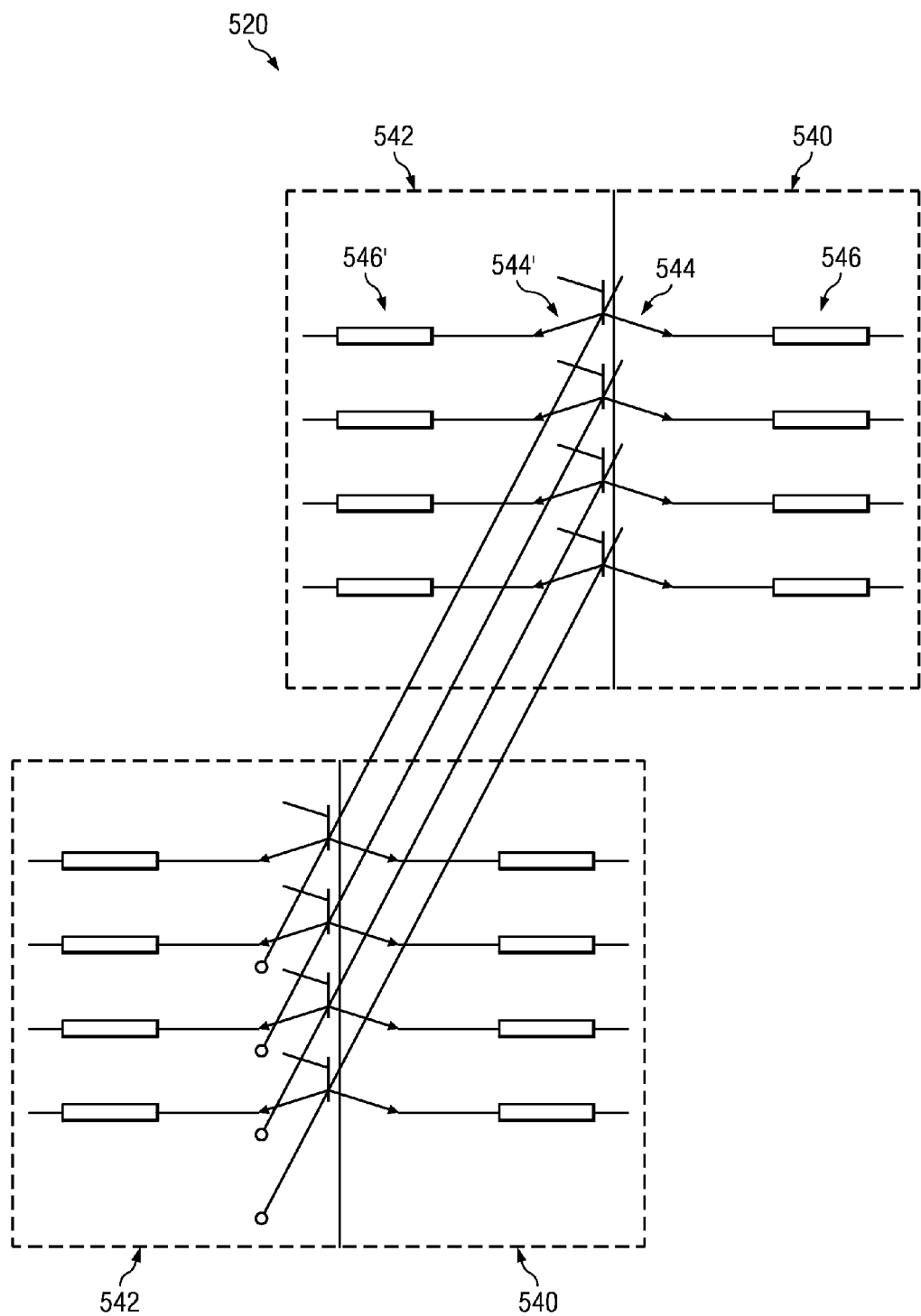
FIG. 5C shows a schematic diagram showing the components defined in the exemplary 3D array structure shown in FIGS. 5A and 5B according to the present disclosure.

Turning to FIG. 5C, in the illustrated embodiment, each transistor array structure 520 may define first and second transistor arrays 540, 542 between first and second memory layers 504A, 504B. The first and second transistor arrays 540, 542 comprise transistors 544, 544' operable to address a respective memory storage region 546, 546' of the first or second memory layers 504A, 504B. Each transistor 544 in the first transistor array 540 comprises one of the first plurality of connector structures 530 and each transistor 544' in the second transistor array 542 comprises one of the second plurality of connector structures 532. In an embodiment, the transistors 544, 544' arranged in each column of the first and second transistor arrays 540, 542 may share one of the plurality of common column structures 522, and transistors 544, 544' arranged in each row of the first and second transistor arrays 540, 542 may share one of the plurality of common base structure 526. In an embodiment, each transistor 544 in the first transistor array 540 and an adjacent transistor 544' in the second transistor array 542 may form a super cell, and the adjacent transistors 544, 544' in each super transistor cell may share one of the plurality of common column structure 522 and one of the plurality of common base structure 526.

It is to be appreciated that depending on impurity concentration and type of the common column structures 522 and the connector structures 530, 532, various types of memory device may be formed. To form a memory devices comprising memory cells 400 or 410 as shown in FIGS. 4A and 4B, the transistors 544, 544' arranged in each column of the first and second transistor arrays 540, 542 may share a common collector structure 522 and may comprise an emitter structure 530, 532 that is spaced apart from the common collector structure 522 by the respective one of the plurality of common base structure 526. To form a memory device comprising memory cells 420 or 430 as shown in FIGS. 4A and 4B, the transistors 544, 544' arranged in each column of the first and second transistor arrays 540, 542 may share a common emitter structure 522 and may comprise a collector structure 530, 532 that is spaced apart from the common emitter structure 522 by the respective one of the plurality of common base structure 526.

Figure 6A:
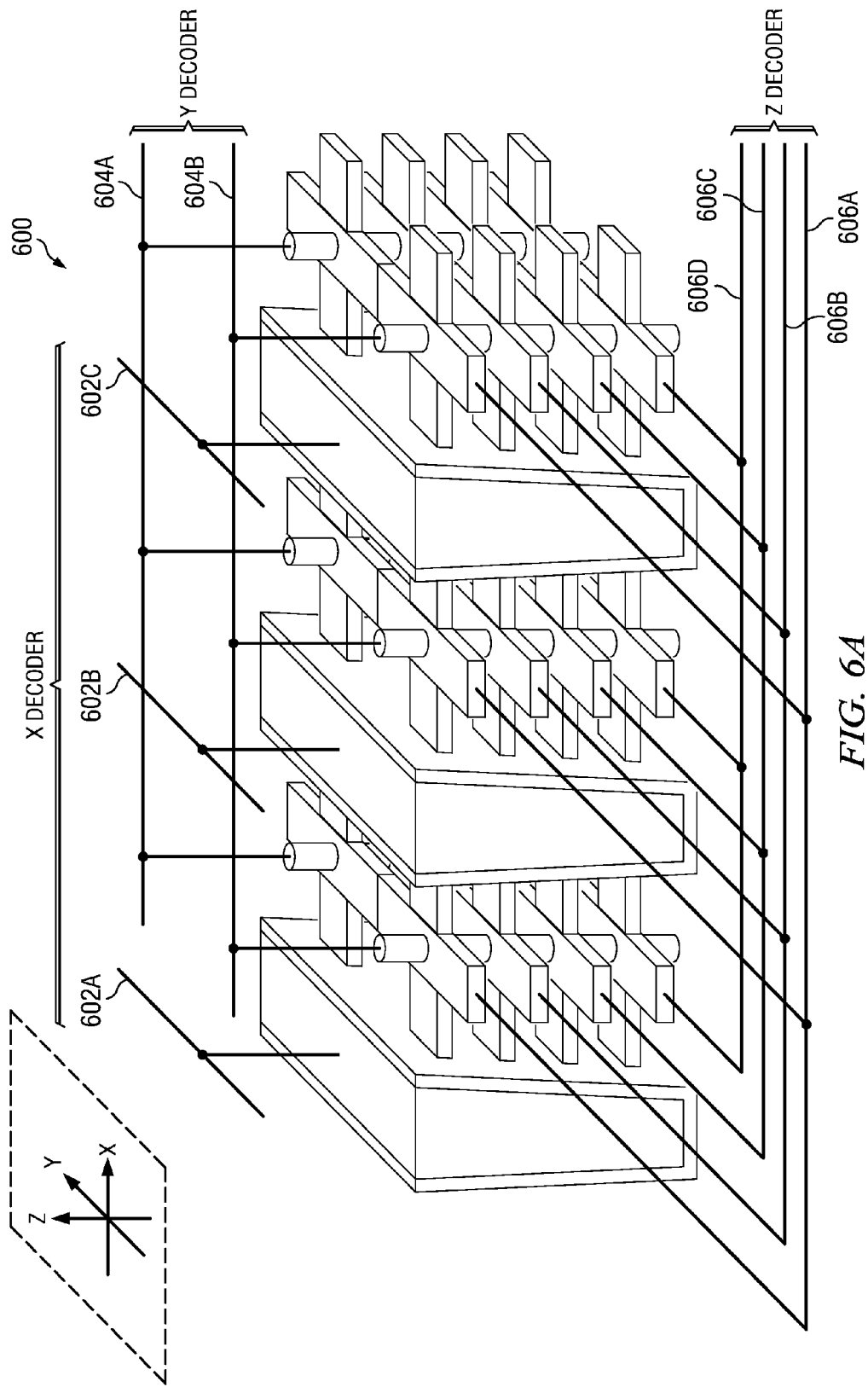
FIGS. 6A and 6B illustrate a first decoding scheme for the exemplary 3D array structure shown in FIG. 5 according to the present disclosure.
Figure 6B:
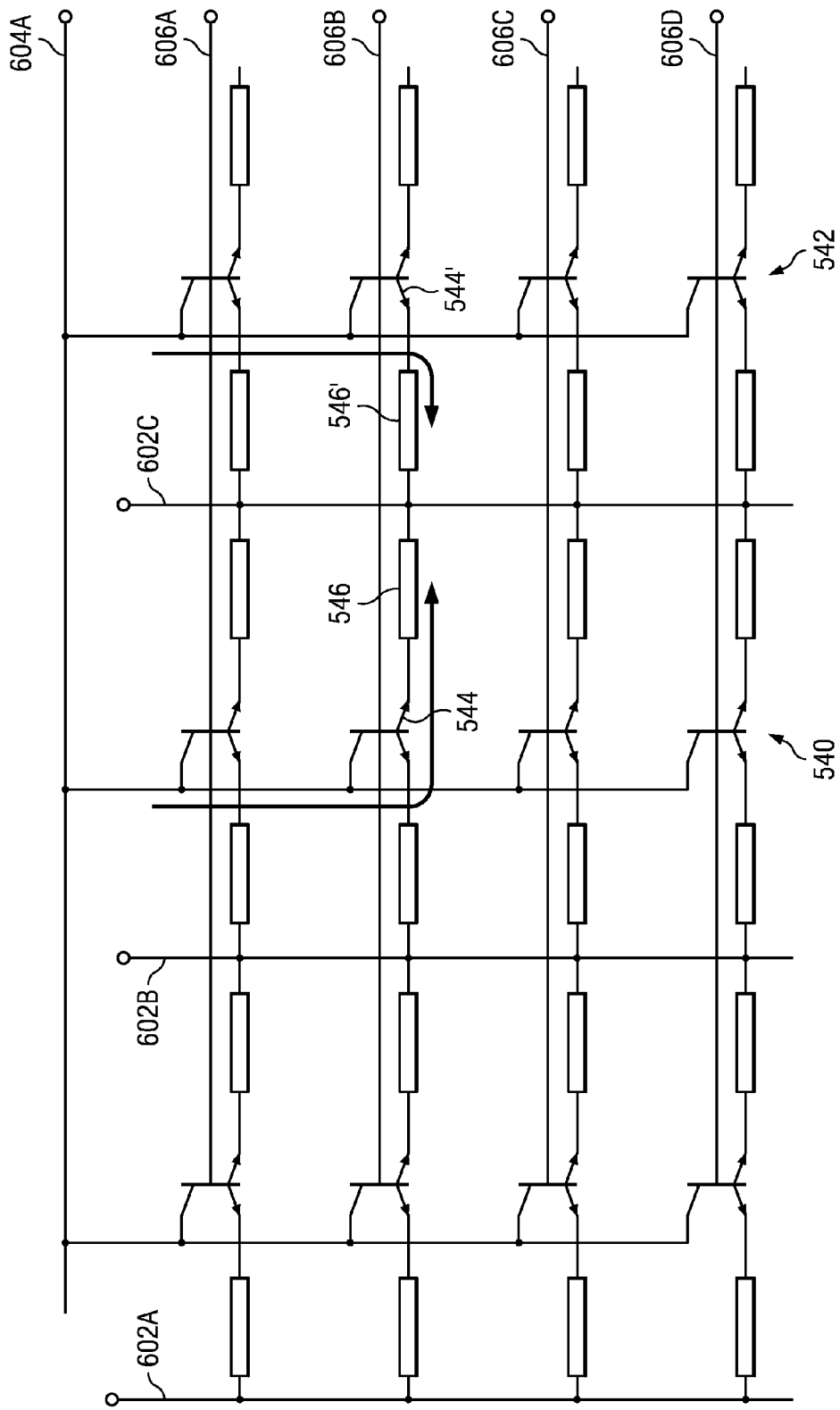

FIGS. 6A and 6B illustrate a memory device 600 comprising the 3D array structure 500 and a first decoding scheme operable to access the memory cells defined in the 3D array structure 500. The memory device 600 comprises X-decoders 602A-C, Y-decoders 604A-B, and Z-decoders 606A-D connected to the 3D array structure 500 to read and write to the memory cells defined in therein.

Referring to FIG. 5A-C and FIG. 6B, the organization of the transistors defined in the 3D array structure 500 may also be understood by using a memory layer 504 as a reference point. In an embodiment, a first transistor array 540 is defined in a first transistor array structure 520 that defines transistors 544 connected to the first surface portion 506 of the memory layer 504. A second transistor array 542 is defined in a second transistor array structure 520 that define transistors 544' connected to the second surface portion 508 of same memory layer 504. Each transistor 544 in the first transistor array 540 is operable to address a respective memory storage region 546 in the first surface portion 506 of the memory layer 504, and each transistor 544' in the second transistor array 542 is operable to address a respective memory storage region 546' in the second surface portion 508 of the memory layer 504.

Referring to FIGS. 6A and 6B now, in the illustrated embodiment, each of the X-decoder 602A-C is connected to one of the electrodes 502, each of the Y-decoder 604A-B is connected to a plurality of common column structures 522 comprising one common column structure 522 from each transistor array structure 520, and each of the Z-decoder 606A-D is connected to a plurality of common base structures 526 comprising one base structure from each transistor array structure 520.

The operation of the first decoder scheme may be illustrated with respect to FIG. 6B. In the illustrated exemplary embodiment, when the combination X-decoder 602C, Y-decoder 604A, and Z-decoder 606B is selected, two memory storage regions 546, 546' are selected. This result is the same for every combination of X-, Y-, and Z-decoders. As such, half of the memory storage region 546, 546' contain repeating memory information, which results in a reduced memory density.

Figure 7A:
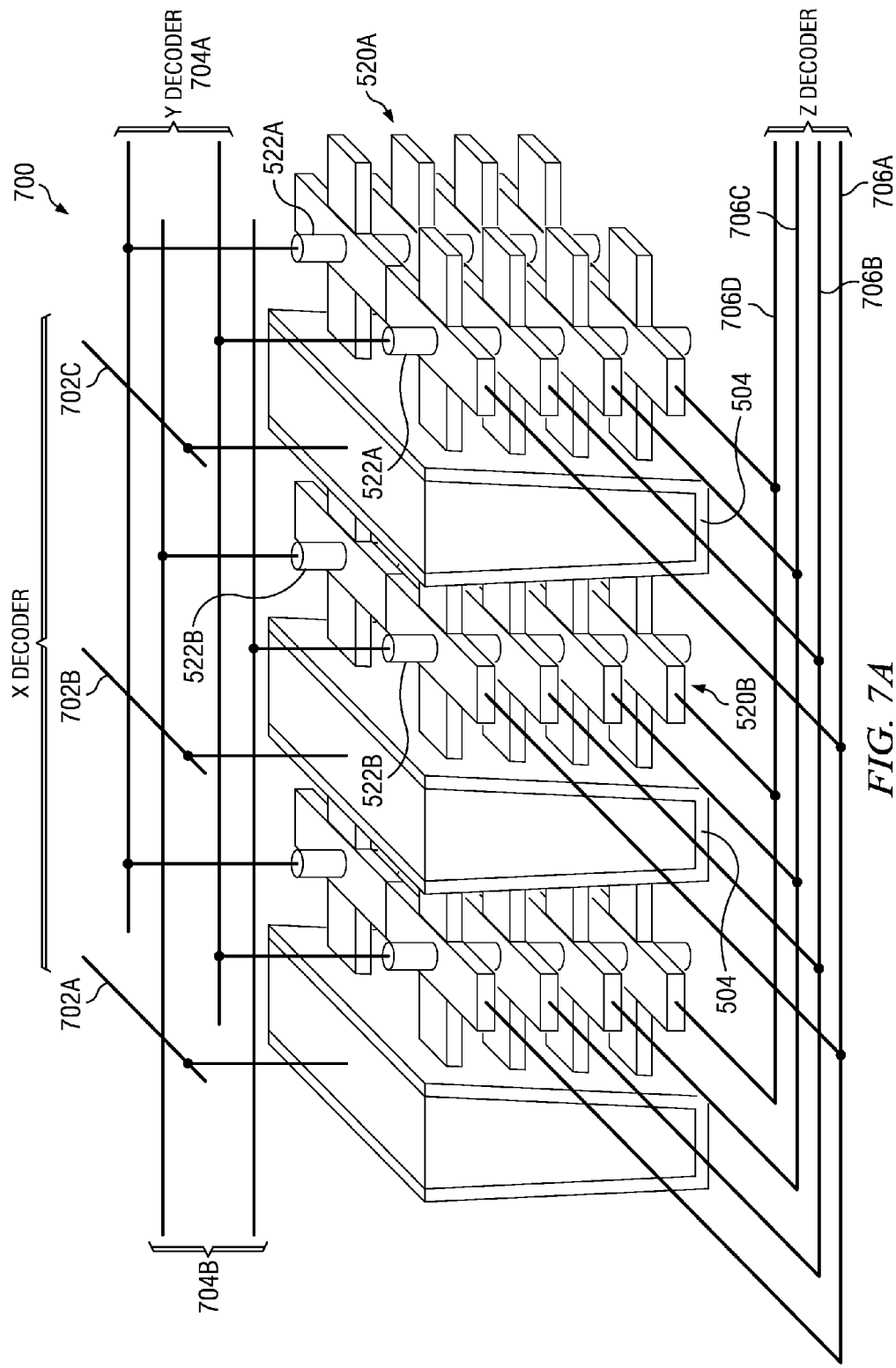
FIGS. 7A and 7B illustrate a second decoding scheme for the exemplary 3D array structure shown in FIG. 5 according to the present disclosure.
Figure 7B:
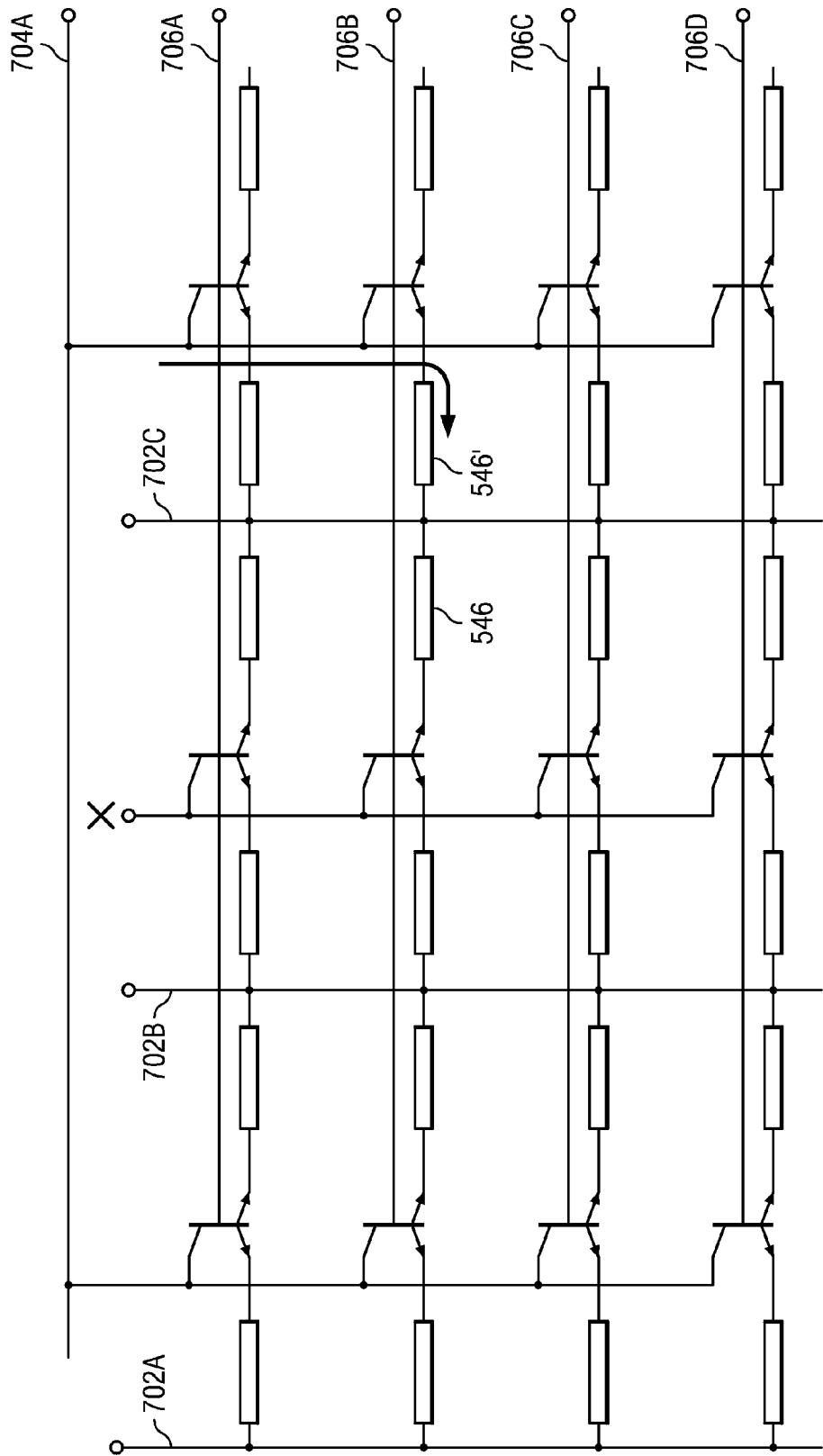

FIGS. 7A and 7B illustrate a memory device 700 comprising the 3D array structure 500 and an improved decoding scheme operable to access the memory cells defined in the 3D array structure 500. As illustrated, electrodes 502 are connected to X-decoders 702A-C. For transistor structures 520A, 520B that are connected to the same memory layer 504, the plurality of common column structures 522A of the first transistor structure 520A and the plurality of common column structures 522B of the second transistor structure 520B are connected to different pluralities of Y-decoders 704A, 704B. The plurality of common base structures 526 of the first and second transistor structures 520A, 520B are connected to a plurality of Z-decoders 706A-D.

The operation of the improved decode scheme may be illustrated with respect to FIG. 7B. In the illustrated exemplary embodiment, when the combination X-decoder 702C, Y-decoder 704A, and Z-decoder 706B is selected, only the memory storage regions 546' is selected. Although the memory storage region 546 shares the same Z-decoder 706B and X-decoder 702C with the memory storage region 546', the memory storage region 546 is not read or addressed by the Y-decoder 704A because the common column structures 522A and the common column structures 522B are connected to different plurality of Y-decoders. As such, unlike the memory storage region 546, 546' programmed by the decode scheme shown in FIGS. 6A and 6B, the memory storage region 546, 546' of FIGS. 7A and 7B do not contain repeating memory information, which results in an increase in memory capacity.

Despite the increase in memory capacity, connecting common column structures 522A and the common column structures 522B to different pluralities Y-decoders 704A, 704B results in the use of twice as many Y-decoders on the top side of the 3D array structure 500. To allow for the patterning and forming of an increased number of Y-decoders across one side of the 3D array structure 500, the arrays of transistors cannot be packed as dense as in the case of no additional Y-decoder. As such, the memory density is not yet optimized.

Figure 8A:
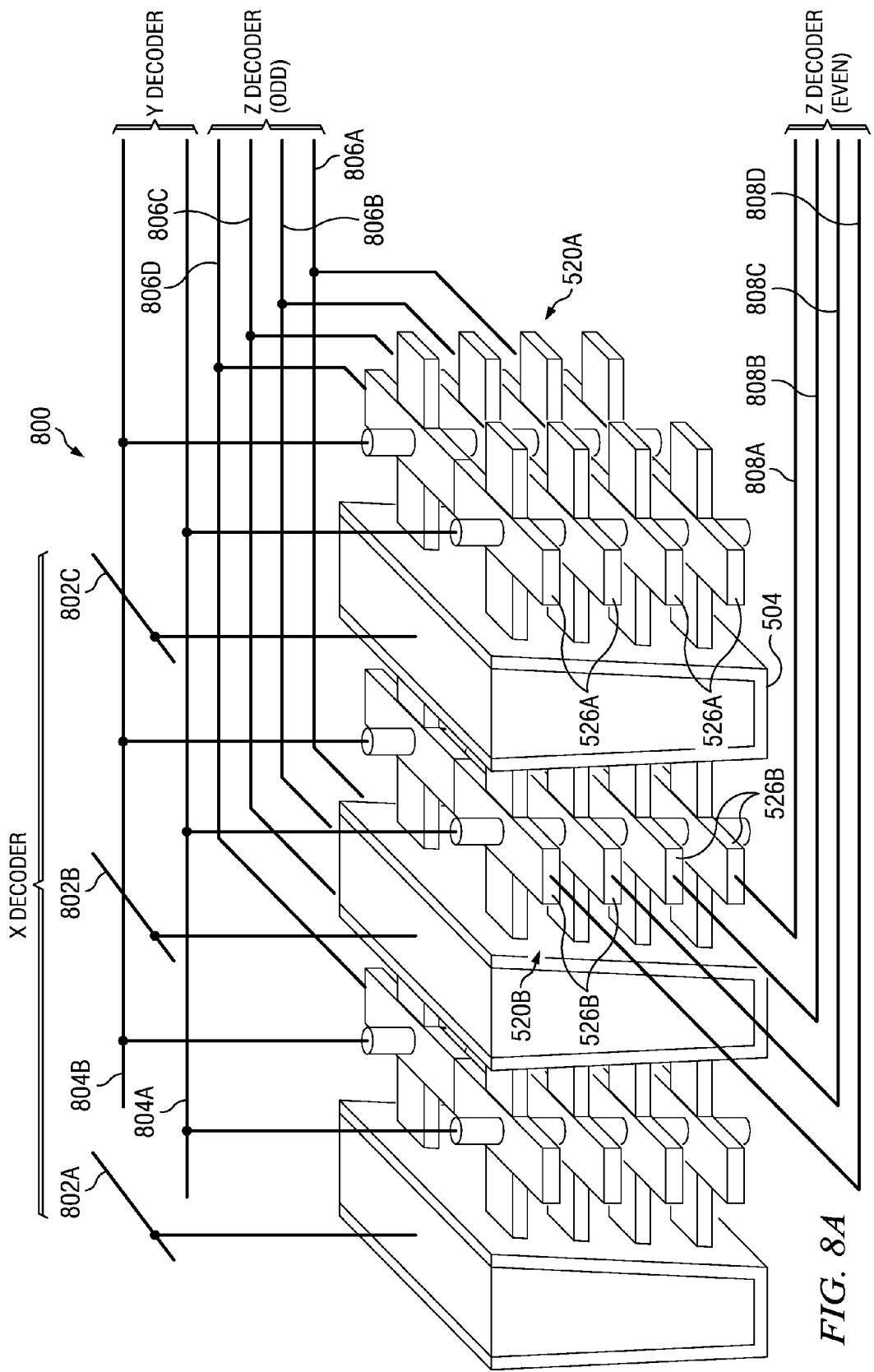
FIGS. 8A and 8B illustrate a third decoding scheme for the exemplary 3D array structure shown in FIG. 5 according to the present disclosure.
Figure 8B:
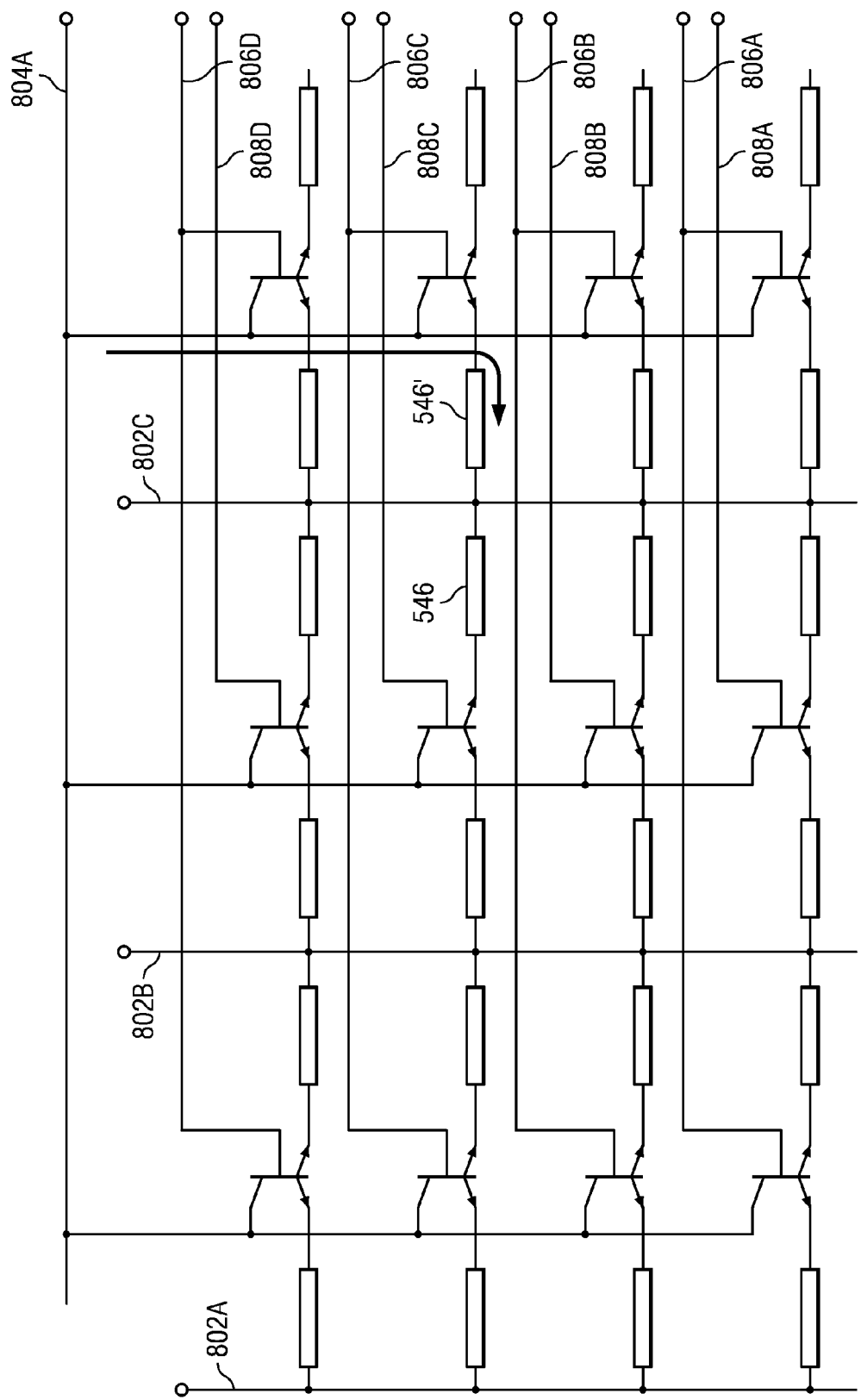

FIGS. 8A and 8B illustrate a memory device 800 comprising the 3D array structure 500 and a preferred decoding scheme operable to access the memory cells defined in the 3D array structure 500 while allowing for optimized memory density. As illustrated, electrodes 502 are connected to X-decoders 802A-C. For transistor structures 520A, 520B that are connected to the same memory layer 504, the plurality of common column structures 522 of the first and second transistor structures 520A, 520B are connected to a plurality of Y-decoders 804A-D. The plurality of common base structures 526A of the first transistor structure 520A and the plurality of common base structures 526B of the second transistor structure 520B are connected to different pluralities of Z-decoders 806A-D, 808A-D, respectively. The Z-decoders 806A-D, 808A-D are located on opposite side of the 3D array structure 500.

The operation of the preferred decode scheme may be illustrated with respect to FIG. 8B. In the illustrated exemplary embodiment, when the combination X-decoder 802C, Y-decoder 804A, and Z-decoder 806C is selected, only the memory storage regions 546' is selected. Although the memory storage region 546 shares the same Y-decoder 804A and X-decoder 802C with the memory storage region 546', the memory storage region 546 is not read or addressed by the Z-decoder 806C because the common base structures 526A and the common base structures 526B are connected to different plurality of Z-decoders 806A-D, 808A-D, respectively. As such, unlike the memory storage region 546, 546' programmed by the decode scheme shown in FIGS. 6A and 6B, the memory storage region 546, 546' of FIGS. 7A and 7B do not contain repeating memory information, which results in an increase in memory capacity.

Furthermore, it is to be appreciated that although the number of Z-decoders in the embodiment of FIGS. 8A and 8B may increase relative to the embodiments in FIGS. 6A, 6B, 7A, and 7b, the additional Z-decoders are accommodated on another side of the 3D array structure rather than being packed on one side of the 3D array structure 500 as in the embodiment of FIGS. 7A and 7B. By avoid doing so, the density of the arrays of transistors in the 3D array structure 500 may remain substantially unchanged, which in turn allows for optimized memory density in the memory device 800.

It is to be appreciated that one advantage that may be allowed by the structure of the transistors and the 3D array structure of the present disclosure is an improvement in the ease and cost of the manufacturing such a 3D array structure. An exemplary method of forming a three-dimensional array structure of the present disclosure will be described with respect to FIGS. 9A-9E.

Figure 9A:
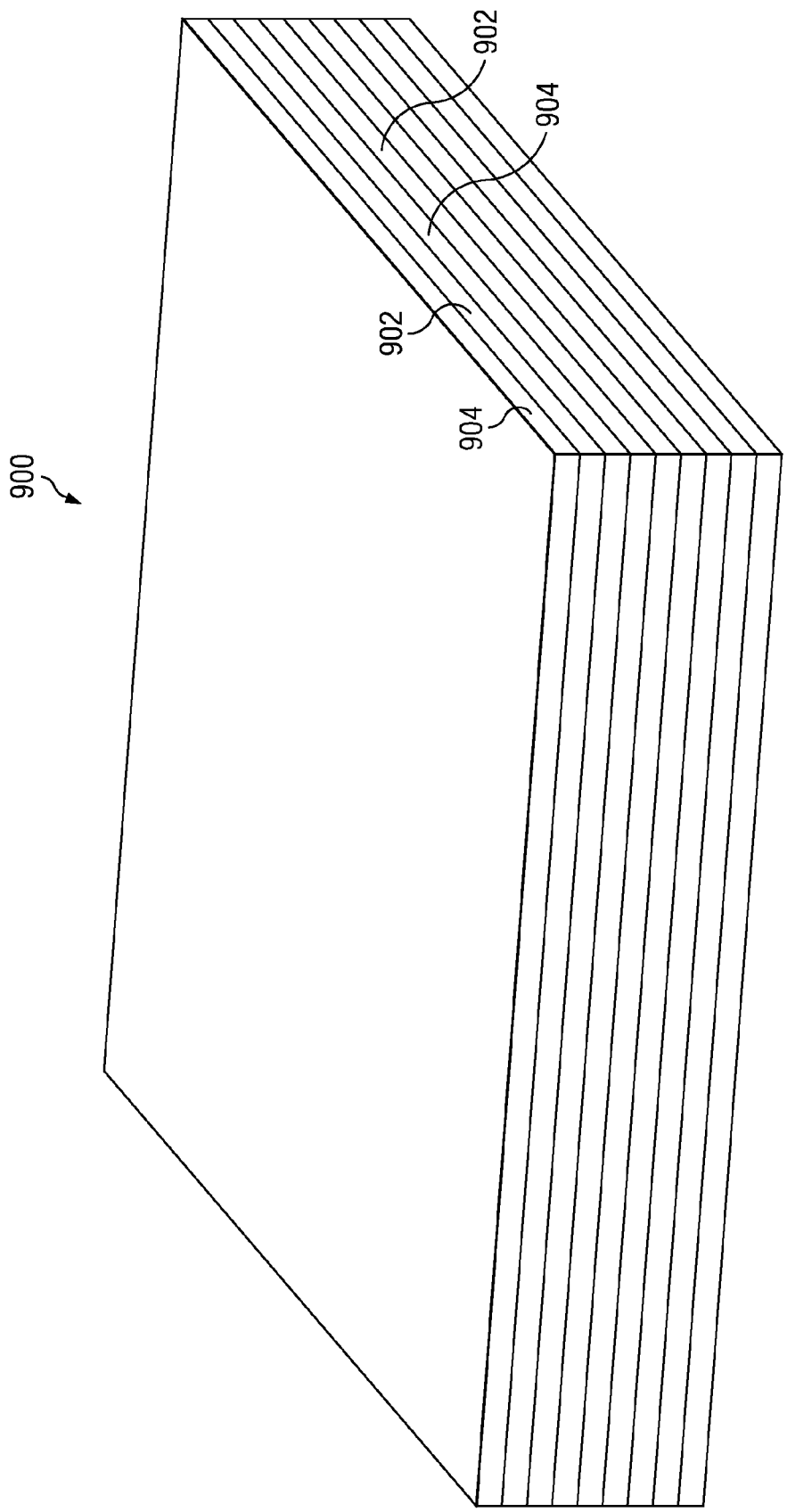
FIG. 9A shows a first intermediate structure that may be formed in the process of manufacturing the 3D structure shown in FIG. 5 according to the present disclosure.

FIG. 9A shows a first intermediate structure 900 comprising semiconductive layers 902 interlaced with dielectric layers 904. The semiconductive layers may include any semiconductive material known in the art, including silicon (Si). The dielectric layer may include any dielectric material know in the art, including silicon oxide ($SiO_2$).

Figure 9B:
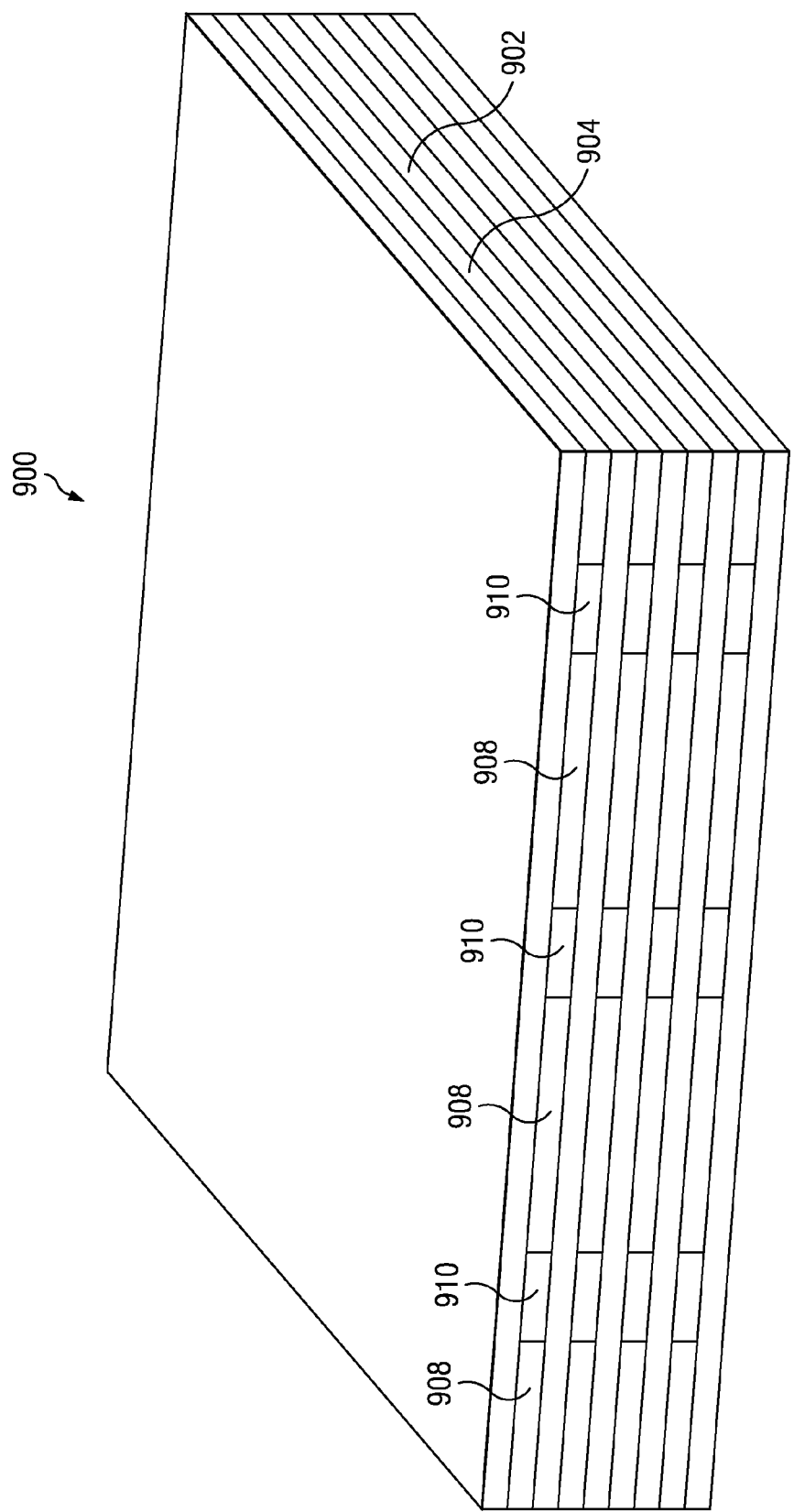
FIG. 9B shows the first intermediate structure as modified in the process of manufacturing the 3D structure shown in FIG. 5 according to the present disclosure.

FIG. 9B shows the first intermediate structure 900 after impurities of a first type are added in a first plurality of regions 908 in each semiconductive layer 902 and impurities of a second type are added in a second plurality of regions 910 in each semiconductive layer 902. The addition of impurities of the first and second type may be performed using any implantation methods known in the art, such ion implantation.

Figure 9C:
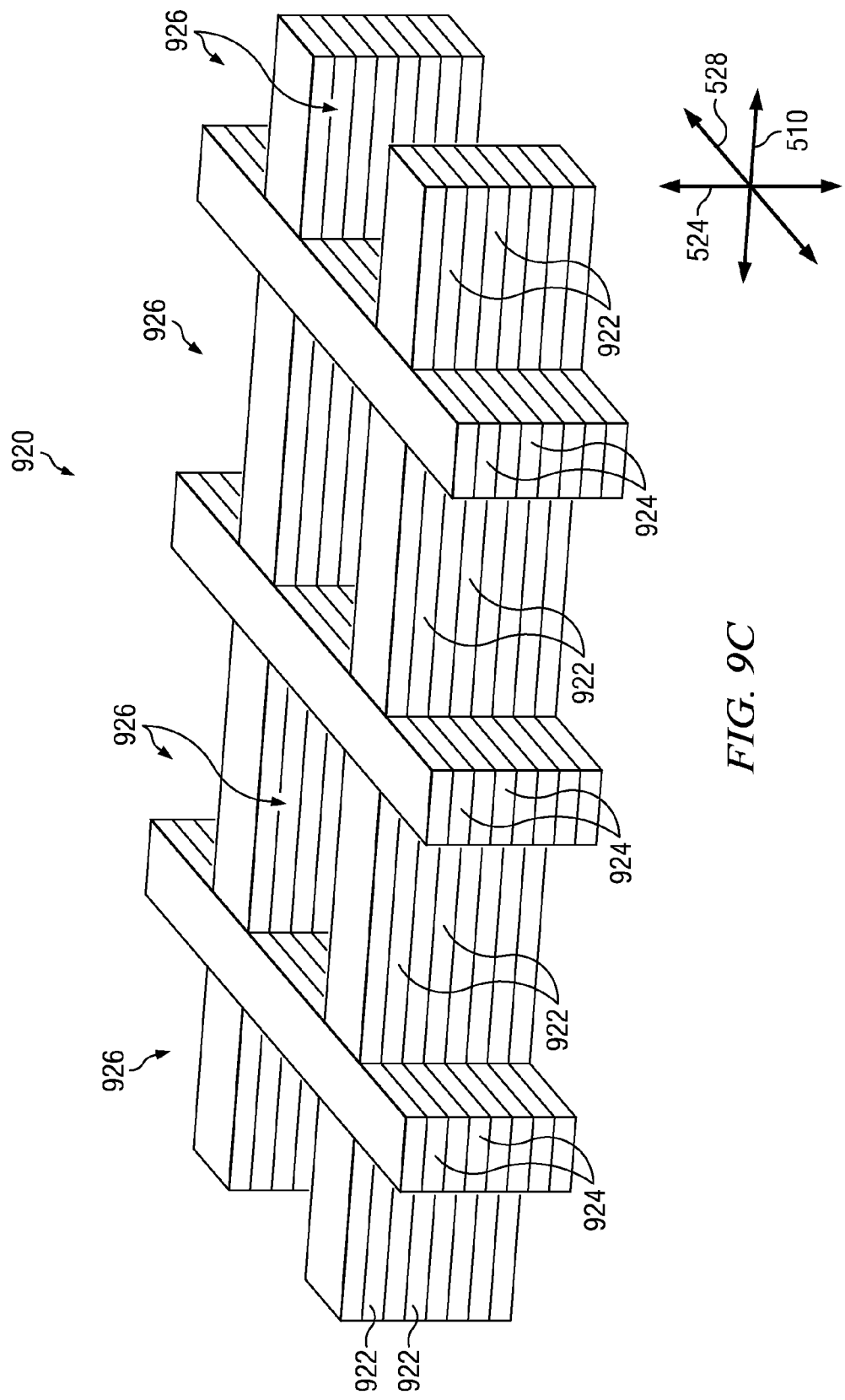
FIG. 9C shows an intermediate array structure that may be formed in the process of manufacturing the 3D structure shown in FIG. 5 according to the present disclosure.

FIG. 9C shows an intermediate array structure 920 that may be formed by removing portions of the first intermediate structure 900 using lithography and etching processes known in the art. The intermediate array structure 920 includes a plurality of connector structures 922 spaced apart along a first longitudinal direction 510 by a plurality of common base structures 924 extending along a second longitudinal direction 528. The plurality of connector structures 922 have impurities of the first type and the plurality of common base structures 924 have impurities of the second type.

Figure 9D:
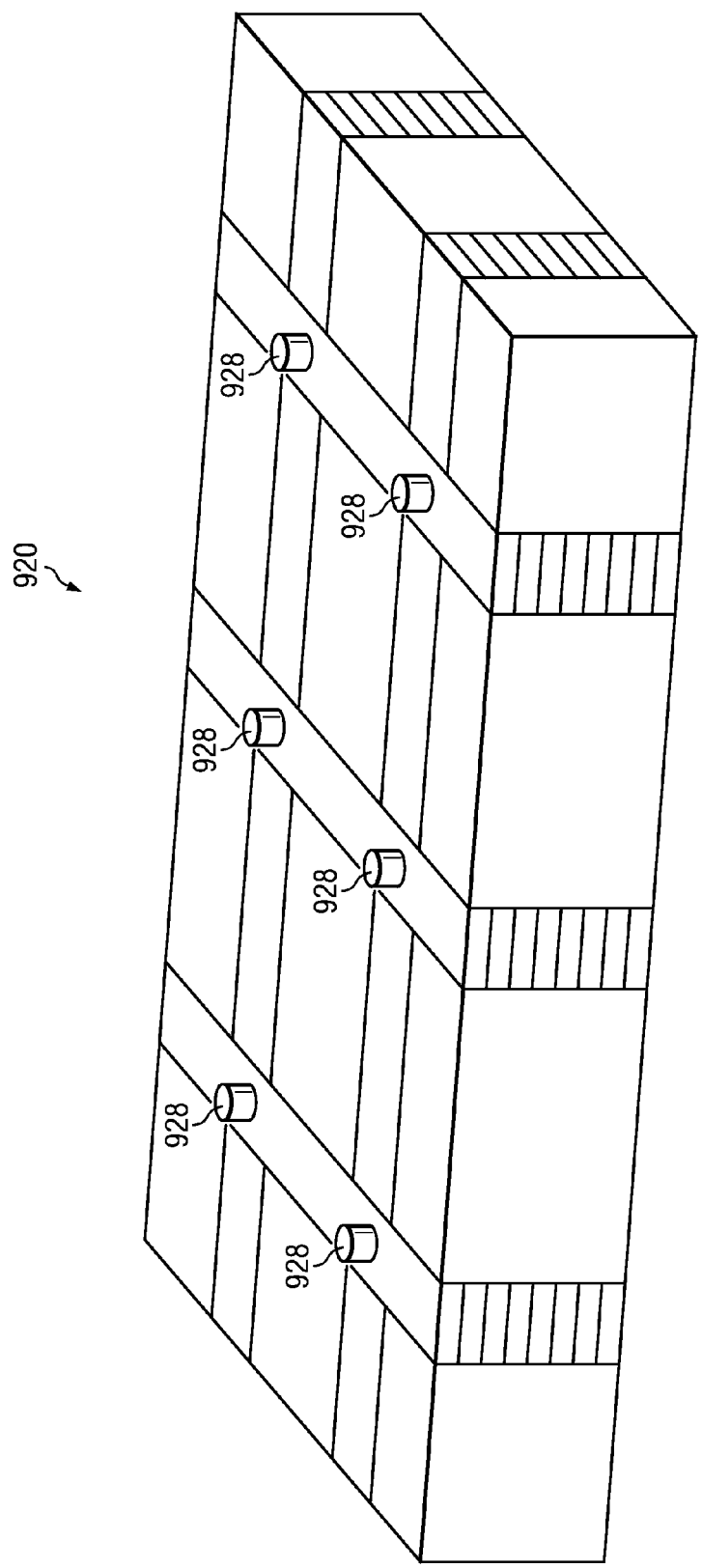
FIG. 9D shows the intermediate array structure as modified in the process of manufacturing the 3D structure shown in FIG. 5 according to the present disclosure.

FIG. 9D shows the intermediate array structure 920 after the voids 926 are filled with a dielectric material and the intermediate array structure 920 is planarized. In addition, the intermediate array structure 920 has also been modified by 1) etching through the plurality of common base structures 924 and the interlacing dielectric layers 904 such that a first plurality of voids are defined in the plurality of common base structures 924; and 2) filling the first plurality of voids with a semiconductive material to form a plurality of common column structures 928 that have impurities of the first type. The plurality of voids and the plurality of common column structures 928 may be located proximate to the plurality of connector structures 922 and extending along the third longitudinal direction 524. In exemplary embodiment, the semiconductive material forming the plurality of common column structures 928 may be doped Si, and may be applied to the plurality of voids using any plug etching technique known in the art.

Figure 9E:
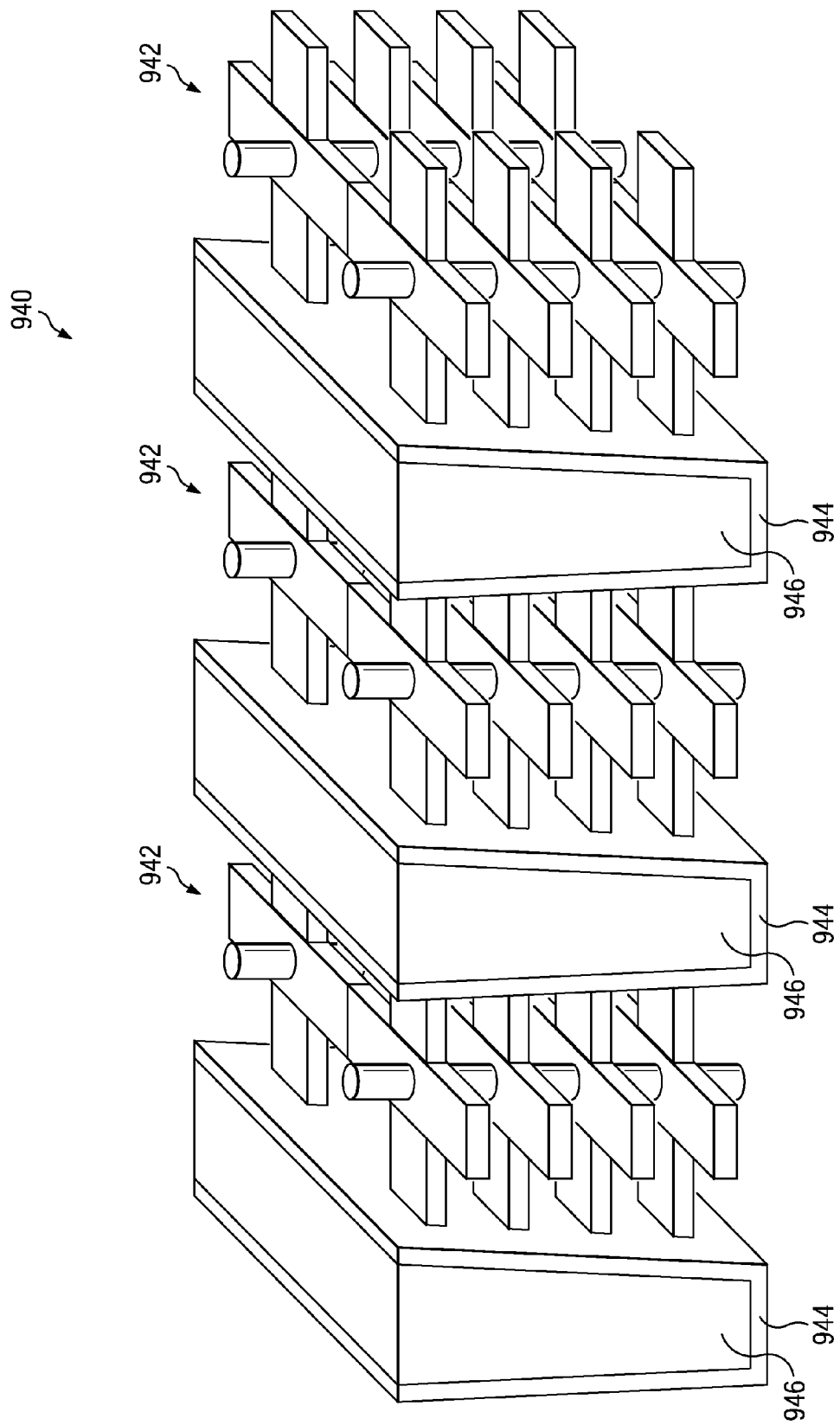
FIG. 9E shows a 3D structure that may be formed in the process of manufacturing the 3D structure shown in FIG. 5 according to the present disclosure.

FIG. 9E shows a 3D structure 940 that may be formed by 1) etching through each of the plurality of connector structures 922 in the intermediate array structure 920 and the interlacing dielectric layers 904 therebetween to form a plurality of transistor structures 942 spaced apart from each other; and 2) depositing memory layers 944 and conduction layers 946 connected to the memory layers 944. The memory layers 944 are deposited between the transistor structures 942 and connected to the connector structures 922 of adjacent transistor structures 942. It is to be appreciated that the transistor structures 942, the memory layers 944, and the conduction layers 946 may be configured according to any embodiments disclosed in the present disclosure. To form a memory device of FIG. 6A, 6B, 7A, 7B, 8A, or 8B, the 3D structure 940 may be modified by connecting the conductive layers 946, the plurality of common column structures 928, and the plurality of common base structures 924 with x-decoders, y-decoders, and z-decoders, respectively.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A memory device, comprising:
   a memory layer having opposing first and second surface portions and being connected to a common electrode; and
   first and second transistor arrays comprising transistors connected to the first and second surface portions of the memory layer, respectively, wherein each transistor in the first transistor array is operable to address a respective memory storage region in the first surface portion of the memory layer, and each transistor in the second transistor array is operable to address a respective memory storage region in the second surface portion of the memory layer;
   wherein the first transistor array comprises common column structures disposed transversely through a plurality of common base structures;
   wherein transistors arranged in each column of the first transistor array share one of the common column structures, and transistors arranged in each row of the first transistor array share one of the common base structures; and wherein the transistors of the first transistor array each comprise a connector structure that is spaced apart from a respective common column structure by a respective common base structure and that is connected to the memory layer.

2. The memory device of claim 1, wherein:
the second transistor array comprises common column structures disposed transversely through a plurality of common base structures;
transistors arranged in each column of the second transistor array share one of the common column structures, and transistors arranged in each row of the second transistor array share one of the common base structures; and
the transistors of the second transistor array each comprise a connector structure that is spaced apart from a respective common column structure by a respective common base structure and that is connected to the memory layer.

3. The memory device of claim 1, wherein the transistors of the first transistor array comprise bipolar junction transistors.

4. The memory device of claim 1, wherein the common column structures of the first transistor array comprise common collector structures, and the connector structure of each transistor in the first transistor array comprises an emitter structure.

5. The memory device of claim 1, wherein the common column structures of the first transistor array comprise common emitter structures, and the connector structure of each transistor in the first transistor array comprises a collector structure.

6. The memory device of claim 1, wherein the common column structures of the first transistor array are oriented orthogonally with respect to the common base structures of the first transistor array.

7. The memory device of claim 1, wherein the connector structure of each transistor in the first transistor array is substantially coplanar with respect to the respective common base structure.

8. A memory device, comprising:
a plurality of electrodes;
memory layers each having opposing first and second surface portions and being connect to one of the plurality of electrodes, wherein the memory layers are spaced apart along a first longitudinal direction; and
one or more transistor array structures between the memory layers, wherein each transistor array structure comprises:
a plurality of common column structures each extending along a second longitudinal direction;
a plurality of common base structures each extending along a third longitudinal direction, wherein the plurality of common column structures are disposed transversely through the plurality of common base structures;
a first plurality of connector structures each extending along the first longitudinal direction and being spaced apart from the plurality of common column structures by one of the plurality of common base structures, the first plurality of connector structures each are connected to the first or second surface portion of one of the memory layers.

9. The memory device of claim 8, wherein:
the first plurality of connector structures each are connected to the first surface portion of a first memory layer;
each transistor array structure further comprises a second plurality of connector structures each extending along the first longitudinal direction and being spaced apart from the plurality of common column structures by one of the plurality of common base structures, the second plurality of connector structures each are connected to the second surface portion of a second memory layer; and
the first surface portion of the first memory layer faces the second surface portion of the second memory layer.

10. The memory device of claim 9, wherein:
each transistor array structure forms first and second transistor arrays between the first and second memory layers, the first and second transistor arrays comprising transistors each operable to address a respective memory storage region of the first or second layers;
transistors arranged in each column of the first and second transistor arrays share one of the plurality of common column structures, and transistors arranged in each row of the first and second transistor arrays share one of the plurality of common base structure; and
each transistor in the first transistor array comprises one of the first plurality of connector structures and each transistor in the second transistor array comprises one of the second plurality of connector structures.

11. The memory device of claim 10, wherein each transistor in the first transistor array and an adjacent transistor in the second transistor array form a super cell, the adjacent transistors in each super transistor cell sharing one of the plurality of common column structure and one of the plurality of common base structure.

12. The memory device of claim 8, wherein the first longitudinal direction is orthogonal to both the second and third longitudinal directions.

13. The memory device of claim 8, wherein the one or more transistor array structures define a plurality of bipolar junction transistors.

14. A memory device, comprising:
first and second electrodes;
first and second memory structures connected to the first and second electrodes, respectively, wherein the first and second memory structures are spaced apart; and
common base structures between the first and second memory structures, the common base structures extending parallel to each other;
common column structures disposed transversely through the common base structures;
common connector structures, each connecting one of the common base structures to the one of the first and second memory layers.

15. The memory device of claim 14, wherein the common base structures, common column structures, and the common connector structure define a plurality of bipolar junction transistors.

16. The memory device of claim 14, wherein the common column structures and the common connector structures have a first type of conductivity, and the common base structures have a second type of conductivity.

17. The memory device of claim 14, wherein the common column structures comprise collectors, and the common connector comprise emitters.

18. The memory device of claim 14, wherein the common column structures comprise emitters, and the common connector comprise collectors.

19. The memory device of claim 14, wherein a resistivity of the first memory layer is operable to be varied by a voltage applied across therein.

* * * * *